US012749208B2

(12) United States Patent
Baram et al.

(10) Patent No.: US 12,749,208 B2
(45) Date of Patent: Sep. 29, 2026

(54) ELECTRON BEAM SPOT SHAPE RECONSTRUCTION UNIT

(71) Applicant: Applied Materials Israel Ltd., Rehovot (IL)

(72) Inventors: Mor Baram, Ness-Ziona (IL); Gadi Oron, Rehovot (IL); Shmuel Mizrachi, Rehovot (IL); David Uliel, Tel-Mond (IL); Ifat Neuberger, Rehovot (IL); Eyal Angel, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 559 days.

(21) Appl. No.: 18/198,768

(22) Filed: May 17, 2023

(65) Prior Publication Data

US 2024/0386589 A1 Nov. 21, 2024

(51) Int. Cl.
*G06T 7/55* (2017.01)
*G06T 3/60* (2024.01)
(Continued)

(52) U.S. Cl.
CPC .................. *G06T 7/55* (2017.01); *G06T 3/60* (2013.01); *G06T 7/12* (2017.01); *G06T 7/60* (2013.01);
(Continued)

(58) Field of Classification Search
CPC .... G06T 7/55; G06T 3/60; G06T 7/12; G06T 7/60; G06T 2207/10152; G06T 2207/20216; G06T 7/50; H01J 37/244; H01J 37/26; H01J 37/222; H01J 37/023; H01J 37/28; G06V 10/25
See application file for complete search history.

(56) References Cited

U.S. PATENT DOCUMENTS

| | | | |
|---|---|---|---|
| 6,670,610 | B2 | 12/2003 | Shemesh et al. |
| 7,002,695 | B2 | 2/2006 | Feldman et al. |

(Continued)

FOREIGN PATENT DOCUMENTS

| | | | |
|---|---|---|---|
| TW | 202211287 | A | 3/2022 |
| WO | 9845869 | A1 | 10/1998 |

(Continued)

OTHER PUBLICATIONS

TW113118119, "Office Action", Jun. 16, 2025, 6 pages.

(Continued)

*Primary Examiner* — David A Vanore
(74) *Attorney, Agent, or Firm* — Kilpatrick Townsend & Stockton LLP

(57) ABSTRACT

An electron beam spot shape reconstruction unit that includes a processing circuit and a memory unit. The processing circuit is configured to reconstruct a shape of an electron beam spot by (i) obtaining multiple groups of images of circular targets of a sample, wherein different groups of images of the multiple groups of images are associated with different polar angles; (ii) processing at least two of the multiple groups of images to determine first-axis edge width information and second-axis edge width information; and (iii) reconstructing the electron beam spot shape based on the first-axis edge width information and second-axis edge width information.

21 Claims, 9 Drawing Sheets

100

(51) Int. Cl.

| | |
|---|---|
| ***G06T 7/12*** | (2017.01) |
| ***G06T 7/60*** | (2017.01) |
| ***H01J 37/244*** | (2006.01) |
| ***H01J 37/26*** | (2006.01) |

(52) U.S. Cl.
CPC ............ *H01J 37/244* (2013.01); *H01J 37/26* (2013.01); *G06T 2207/10152* (2013.01); *G06T 2207/20216* (2013.01)

(56) References Cited

U.S. PATENT DOCUMENTS

| | | | |
|---|---|---|---|
| 8,709,269 | B2 | 4/2014 | Shemesh |
| 9,911,571 | B2 | 3/2018 | Basson |

FOREIGN PATENT DOCUMENTS

| | | | | |
|---|---|---|---|---|
| WO | WO-2018228436 A1 * | 12/2018 | ............... | G06T 7/85 |
| WO | WO-2020156341 A1 * | 8/2020 | ............. | G06T 7/579 |

OTHER PUBLICATIONS

KR10-2024-0064531, "Office Action", Sep. 2, 2025, 3 pages.
TW113118119, "Notice of Decision to Grant", Oct. 1, 2025, 4 pages.

* cited by examiner

100

11

12-1

12-2

ELECTRON BEAM SPOT SHAPE RECONSTRUCTION UNIT

BACKGROUND OF THE INVENTION

A sample may be evaluated by scanning, by an electron beam system, one or more areas of the sample with an electron beam that forms a spot on the one or more areas.

The shape of the spot may be impacted by various parameters of the electron beam system.

There is a growing need to provide an accurate method for reconstructing the spot of the electron beam.

BRIEF SUMMARY OF THE INVENTION

There may be provided an electron beam spot shape reconstruction unit that includes a processing circuit and a memory unit. The processing circuit is configured to reconstruct a shape of an electron beam spot by (i) obtaining multiple groups of images of circular targets of a sample, wherein different groups of images of the multiple groups of images are associated with different polar angles; (ii) processing at least two of the multiple groups of images to determine first-axis edge width information and second-axis edge width information; and (iii) reconstructing the electron beam spot shape based on the first-axis edge width information and second-axis edge width information.

There may be provided a method for electron beam spot shape reconstruction, the method may include (i) obtaining multiple groups of images of circular targets of a sample, wherein different groups of images of the multiple groups of images are associated with different polar angles; (ii) processing, by an electron beam spot shape reconstruction unit, at least two of the multiple groups of images to determine first-axis edge width information and second-axis edge width information; and (iii) reconstructing the electron beam spot shape based on the first-axis edge width information and second-axis edge width information.

There may be provided a non-transitory computer readable medium (e.g., a computer-readable memory, such as a random access memory or any other appropriate computer-readable memory unit) for electron beam spot shape reconstruction, the non-transitory computer readable medium stores instructions that once executed by a processing circuit, cause the processing circuit to: (i) obtain multiple groups of images of circular targets of a sample, wherein different groups of images of the multiple groups of images are associated with different polar angles; (ii) process at least two of the multiple groups of images to determine first-axis edge width information and second-axis edge width information; and (iii) reconstruct the electron beam spot shape based on the first-axis edge width information and second-axis edge width information.

BRIEF DESCRIPTION OF THE DRAWINGS

The subject matter regarded as the invention is particularly pointed out and distinctly claimed in the concluding portion of the specification. The invention, however, both as to organization and method of operation, together with specimen s, features, and advantages thereof, may best be understood by reference to the following detailed description when read with the accompanying drawings in which:

Figure 1:
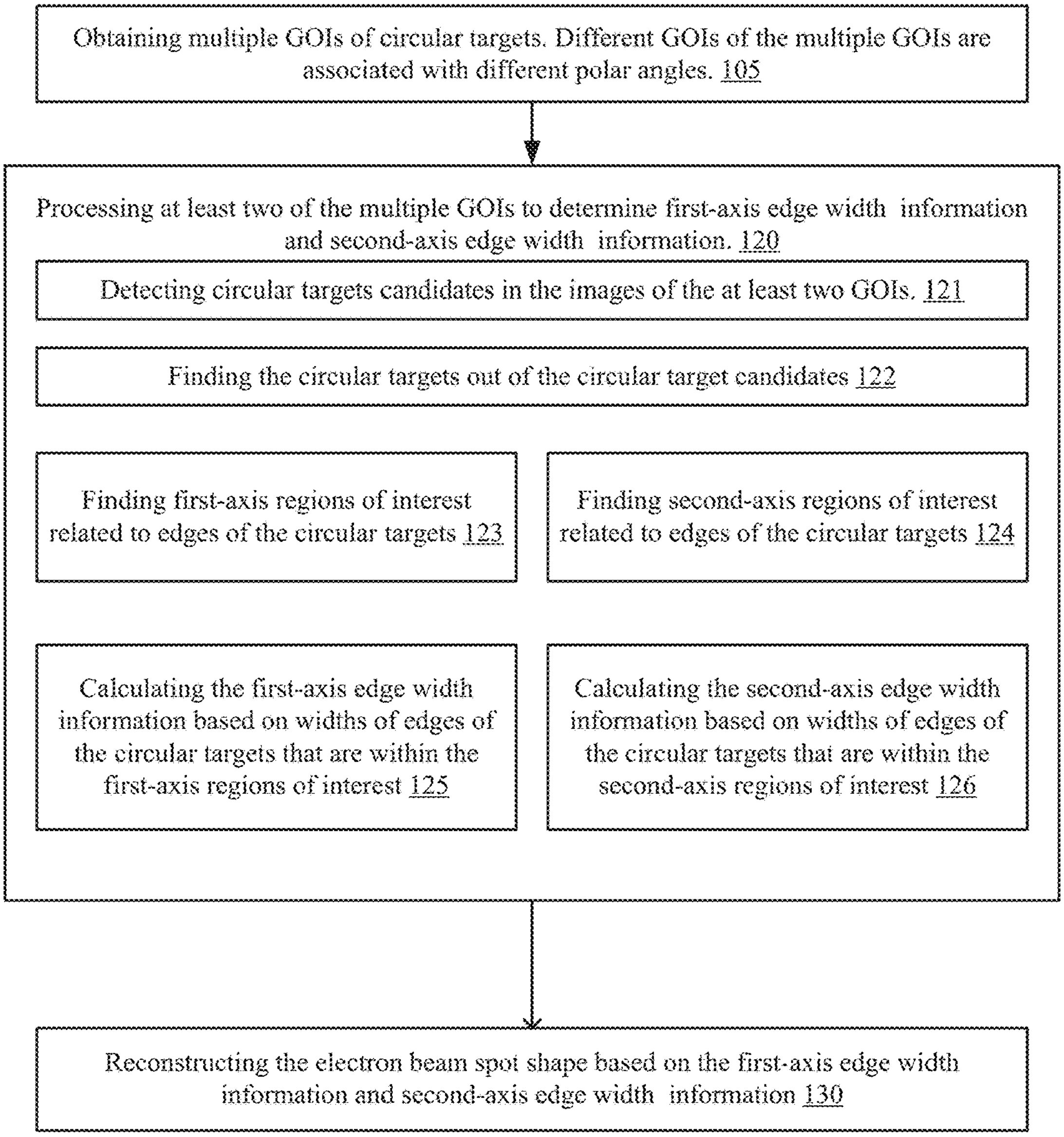
FIG. 1 illustrates an example of a method.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer program product that stores instructions that once executed result in the execution of the method.

Any reference in the specification to a system should be applied mutatis mutandis to a method that may be executed by the system, and should be applied mutatis mutandis to a computer program product that stores instructions that can be executed by the system.

Any reference in the specification to a computer program product should be applied mutatis mutandis to a method that may be executed when executing instructions stored in the computer program product and should be applied mutandis to a system that is configured to executing instructions stored in the computer program product.

The term and/or means additionally or alternatively. For example A and/or B means only A, or only B or a combination of A and B.

There may be provided an electron beam spot shape reconstruction unit that is configured to reconstruct the shape of an electron beam spot.

A determination of the shape of the electron beam spot may be used to for various purposes—for example for correcting one or more parameters of the electron beam system, and/or for equalizing the electron beam spot shape and size of different electron beam systems, and the like.

The equalization between the shape and the size of the electron beam spot generated by different electron beam systems facilitates a comparison between measurements obtained by the different electron beam systems.

The electron beam spot shape reconstruction is based on first axis edge width information and second axis edge width information generated based on multiple groups of images (GOIs) of circular targets.

A GOI of the circular targets may include different images that differ from each other by the circular targets that are capture by the different images, so that a single image may capture only some of the circular target. Assuming that the GOI capture a group of circular targets, one image of the GOI may capture a sub-group of the group of circular targets and another image of the GOI may capture another sub-group of the of the group of circular targets. A circular target of the group of circular targets may be captured in one or more of the images of the GOI.

The electron beam spot shape reconstruction unit may receive the multiple GOIs.

The electron beam spot shape reconstruction unit may receive one or more GOIs and may generate one or more other GOIs.

An acquired image may be generated by acquiring multiple frames and averaging the frames. The averaging of the frames increases the signal to noise ratio of the image. Capturing more frames per acquired image may increase the signal to noise ratio of the image.

FIG. 1 illustrates an example of method 100 for electron beam spot shape reconstruction.

Method 100 may start by step 105 of obtaining multiple GOIs of circular targets.

Different GOIs of the multiple GOIs are associated with different polar angles.

The association means that while one GOI is captured or generated by digital processing from one polar angle, another GOI is captured or generated by digital processing from another polar angle. Examples of GOI that are associated with different polar angles are provided below:

a. A captured GOI that is obtained by illuminating circular targets of a sample with an electron beam that forms the electron beam spot on the sample, and one or more virtually rotated GOIs that are generated by virtually polar angle rotating the captured group of images.
b. Different captured GOIs that are obtained by illuminating the circular targets of the sample with electron beams having different polar angles of illumination.
c. Two or more captured GOIs captures using electron beams having that differ by polar angles of illumination, and one or more virtually rotated GOIs associated with one or more virtual polar angles, whereas the polar angles (virtual or actual) differ from each other.
d. Different virtually rotated GOIs that are rotated by polar angles that differ from each other.

A virtual rotation may include recalculating pixels to correspond to the pixels of the virtually rotated GOI. For example, pixels of an image have a rectangular shape that is aligned to the x-axis and the y-axis of the image. When the image is virtually rotated the pixels should be re-aligned to the new axis of the virtually rotated image. The re-alignment may include extrapolation, manipulation, and the like.

The obtaining of the images may include receiving one or more GOIs of the multiple GOIs and/or generating one or more GOIs of the multiple GOIs.

The multiple GOIs may include (a) a captured GOI that is obtained by illuminating circular targets of a sample with an electron beam that forms the electron beam spot on the sample, and (b) one or more virtually rotated GOIs that are generated by virtually polar angle rotating the captured group of images.

Step 105 may include capturing the captured GOI, and/or controlling the acquisition of the captured GOI, and/or receiving the captured GOI.

Additionally or alternatively, step 105 may include receiving the one or more virtually rotated GOIs, or generating the one or more virtually rotated GOIs.

Alternatively, the GOIs may include multiple captured GOIs, wherein different captured GOIs are obtained by illuminating the circular targets of the sample with electron beams having different polar angles of illumination.

Step 105 may include receiving one or more of the captured GOIs and/or generating the one or more captured GOIs and/or controlling an acquisition of the one or more captured GOIs.

A GOI of the circular targets may include different images that differ from each other by the circular targets that capture so that an image may capture only some of the circular target.

Step 105 may be followed by step 120 of processing at least two of the multiple GOIs to determine first-axis edge width information and second-axis edge width information.

The first-axis differs from the second-axis. For example, the first-axis may be normal to the second-axis. For simplicity of explanation it is assumed that the first-axis is the x-axis and the second-axis is the y-axis. Any other pairs of axes that are oriented to each other by any other angle may be provided.

Step 120 of processing may include at least some steps of steps 121, 122, 123, 124, 125 and 126.

Step 121 may include detecting circular targets candidates in the images of the at least two GOIs.

Step 121 may include finding edges of objects within the at least two GOIs.

Step 121 may include at least one out of:

a. Generating derivative images, which are generated by calculating derivatives of the images of the at least two GOIs. The derivatives may be taken along any axis.
b. Segmenting the derivative images by applying any segmentation process, for example, by using the Otsu segmentation algorithm. The segmenting may provide circular targets candidates.
c. Performing blob analysis. The blob analysis is an example of an edge detection process that finds edges of objects.

Step 121 may be followed by step 122 of finding the circular targets out of the circular target candidates. The finding may include ignoring irrelevant circular targets candidates.

Step 122 may include ignoring circular targets candidates that do not fulfill one or more predefined conditions.

The predefined conditions may be related to at least one out of (i) the size of the target (for example—ignoring targets having an area below a threshold), (ii) a radial symmetry of the targets (for example—deviation from circularity that exceeds a threshold), (iii) solidity of the targets, (iii) distance between targets (for example, removing a target that is too close (for example—distance below a threshold) from another target, and the like.

Step 122 may be followed by steps 123 and 124.

Step 123 may include finding first-axis regions of interest related to edges of the circular targets—for images of the at least two GOIs.

Step 123 may be followed by step 125 of calculating the first-axis edge width information based on widths of edges of the circular targets that are within the first-axis regions of interest—for images of the at least two GOIs.

The first-axis widths of the edges may be generated by processing information about first-axis widths of the edges within each GOI of the GOIs to provide first-axis width information of the GOI.

The processing may include at least one of:

a. Ignoring outliers (for example, the 5% or 10% or any other percent of the minimal first-axis widths of the edges and/or of the maximal first-axis widths of the edges).
b. Generating a first-axis widths histogram of the first-axis widths of the edges. A histogram may be provided per a single GOI, per the at least two GOIs or per a smaller set of images.
c. Smoothing the histogram.
d. Finding a peak of the histogram. For example, by a applying at least one algorithm out of fit to norm, mean shift, or fit to parabola and find the peak of the parabola. The first-axis edge width may equal the height of the peak of the histogram.

Step 124 may include finding second-axis regions of interest related to edges of the circular targets—for images of the at least two GOIs.

Step 124 may be followed by step 126 of calculating the second-axis edge width information based on widths of edges of the circular targets that are within the second-axis regions of interest for images of the at least two GOIs.

The second-axis widths of the edges may be generated by processing information about second-axis widths of the edges within each GOI of the GOIs to provide second-axis width information of the GOI.

The processing may include at least one of:

a. Ignoring outliers (for example the 5% or 10% or any other percent of the minimal second-axis widths of the edges and/or of the maximal second-axis widths of the edges).
b. Generating a second-axis widths histogram of the second-axis widths of the edges. A histogram may be provided per a single GOI, per the at least two GOIs or per a smaller set of images.
c. Smoothing the histogram.
d. Finding a peak of the histogram. For example, by a applying at least one algorithm out of fit to norm, mean shift, or fit to parabola and find the peak of the parabola. The second-axis edge width may equal the height of the peak of the histogram.

Step 120 may be followed by step 130 of reconstructing the electron beam spot shape based on the first-axis edge width information and second-axis edge width information.

The first-axis edge width information may provide an indication about an distance, along the first-axis, between two points of the edge of the spot of the electron beam.

The second-axis edge width information may provide an indication about an distance, along the second-axis, between two points of the edge of the spot of the electron beam.

The reconstruction provides the distance along multiple first-axis polar angles and multiple second-axis polar angles as the different GOIs are associated with different polar angles. For different GOIs, their first-axes are polar angle rotated version of each other. Using GOIs that are associated with different polar angles increases the accuracy of the reconstructions. Increasing the number of different polar angles further increases the accuracy of the reconstruction.

FIG. 1 referred to candidate circular targets, circular targets, first-axis region of interest, and second-axis region of interest. FIGS. 2, 3, 4 and 5 provide examples of candidate circular targets, circular targets, first-axis region of interest, and second-axis region of interest. Accordingly—the candidate circular targets, circular targets, first-axis region of interest, and second-axis region of interest of FIGS. 2, 3, 4 and 5 were generated by applying method 100.

Figure 2:
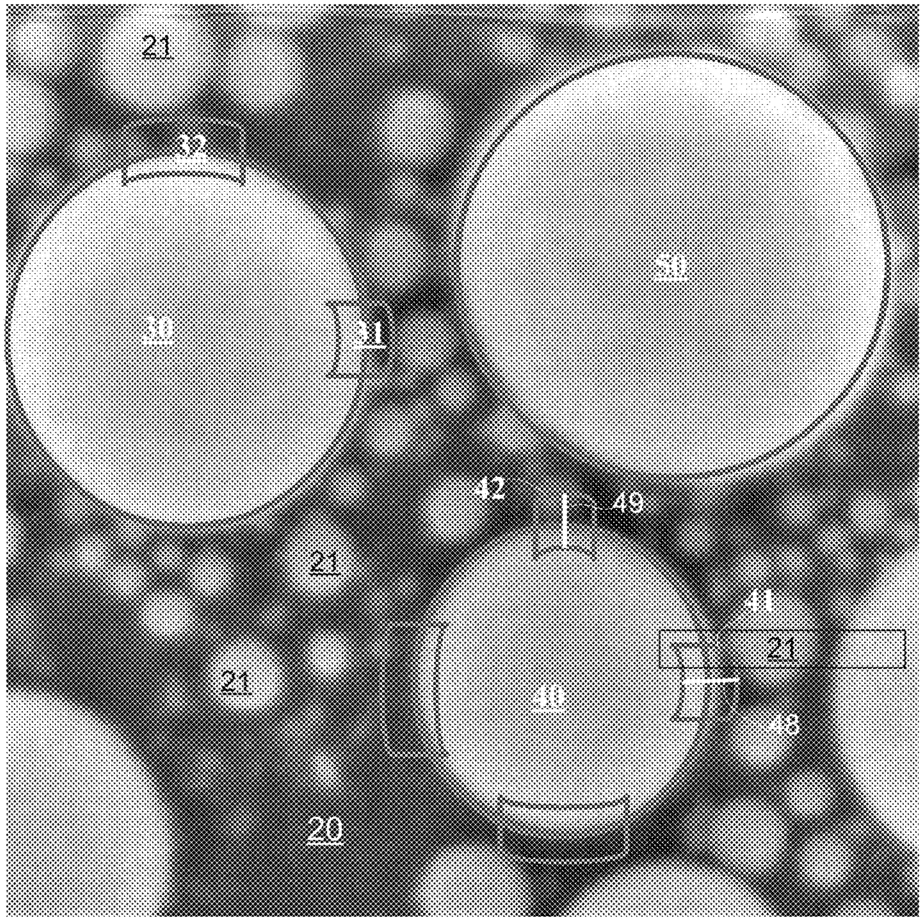
FIG. 2 illustrates an example of an image.

FIG. 2 illustrates an example of an image 11 of a first circular target 20, a second circular target 40, a third circular target 50, and a background 20 that includes ignored candidate circular targets 21.

FIG. 2 also illustrates first-axis region of interest 31 of first circular target 30, second-axis region of interest 32 of first circular target 30, first-axis region of interest 41 (and first-axis 48) of second circular target 40, and second-axis region of interest 42 (and second-axis 49) of second circular target 30. Although the regions of interests of FIG. 2 are delimited by relatively large shapes, any region of interest may be confined to a segment of the edge of the circular target.

Figure 3:
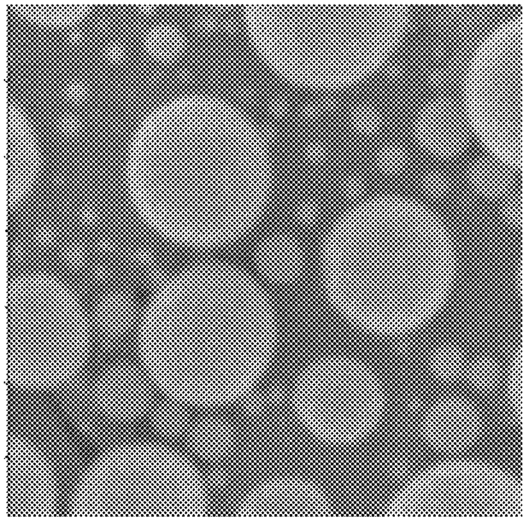
FIG. 3 illustrates an example of images and pixels.
Figure 3:
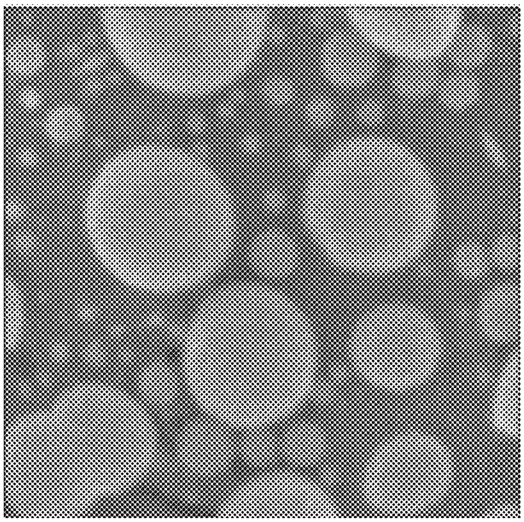
Figure 3:
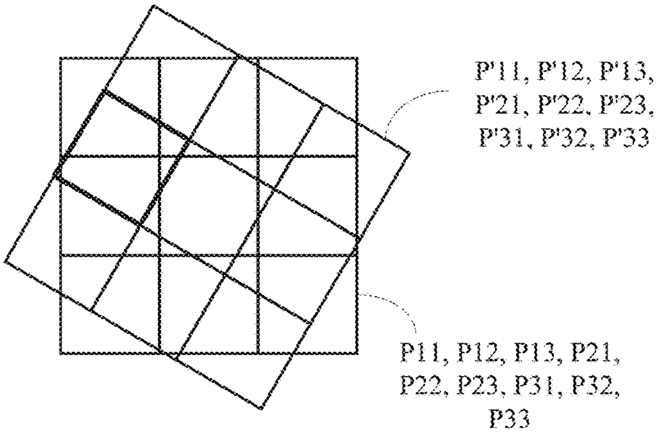
Figure 3:
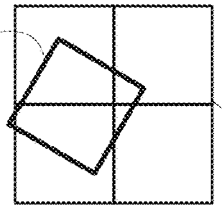

FIG. 3 illustrates an example of an image 12-1 of circular targets and their surrounding and a virtually rotated image 12-2 that is virtually polar angle rotated (clockwise) by thirty degrees. FIG. 3 also illustrates nine pixels (denoted P11, P12, P13, P21, P22, P23, P31, P32 and P33) of image 12-1, and the interpolation of these nine pixels to provide nine pixels (denoted P'11, P'12, P'13, P'21, P'22, P'23, P'31, P'32 and P'33) of the virtually rotated image 12-2. For example, pixel P'21 of virtually rotated image 12-2 may be calculated based on pixels P11, P12, P21 and P22 of image 12-1, as there is a partial overlap between pixel P'21 and each one of pixels P11, P12, P21 and P22.

Figure 4:
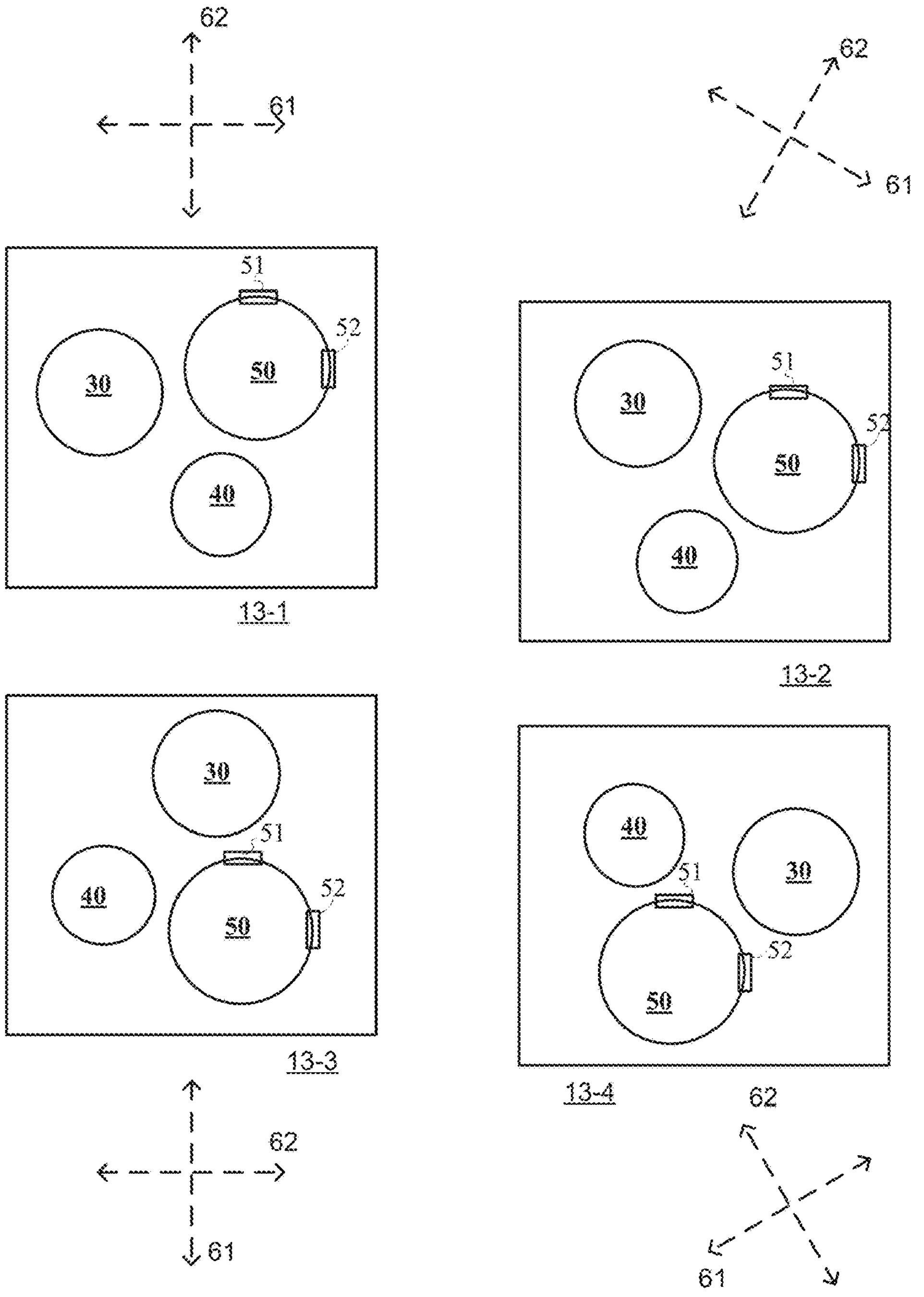
FIG. 4 illustrates an example of images.

Method 100 of FIG. 1 includes obtaining images that are associated with different polar angles. FIG. 4 provides an example of four images that are associated with four different polar angles.

FIG. 4 illustrates an example of image 13-1 of a first circular target 20, a second circular target 30, a third circular target 50, first virtually rotated images 13-2, second virtually rotated image 13-3 and third virtually rotated image 13-4 of the first circular target 20, the second circular target 30 and the third circular target 50.

FIG. 4 also illustrates the manner in which the first-axis 61 and the second-axis 62 (aligned to image 13-1) are impacted by the rotation.

FIG. 4 further illustrates first-axis region of interest 51 of the third circular target 50 at each one of image 13-1, first virtually rotated images 13-2, second virtually rotated image 13-3 and third virtually rotated image 13-4.

Figure 5:
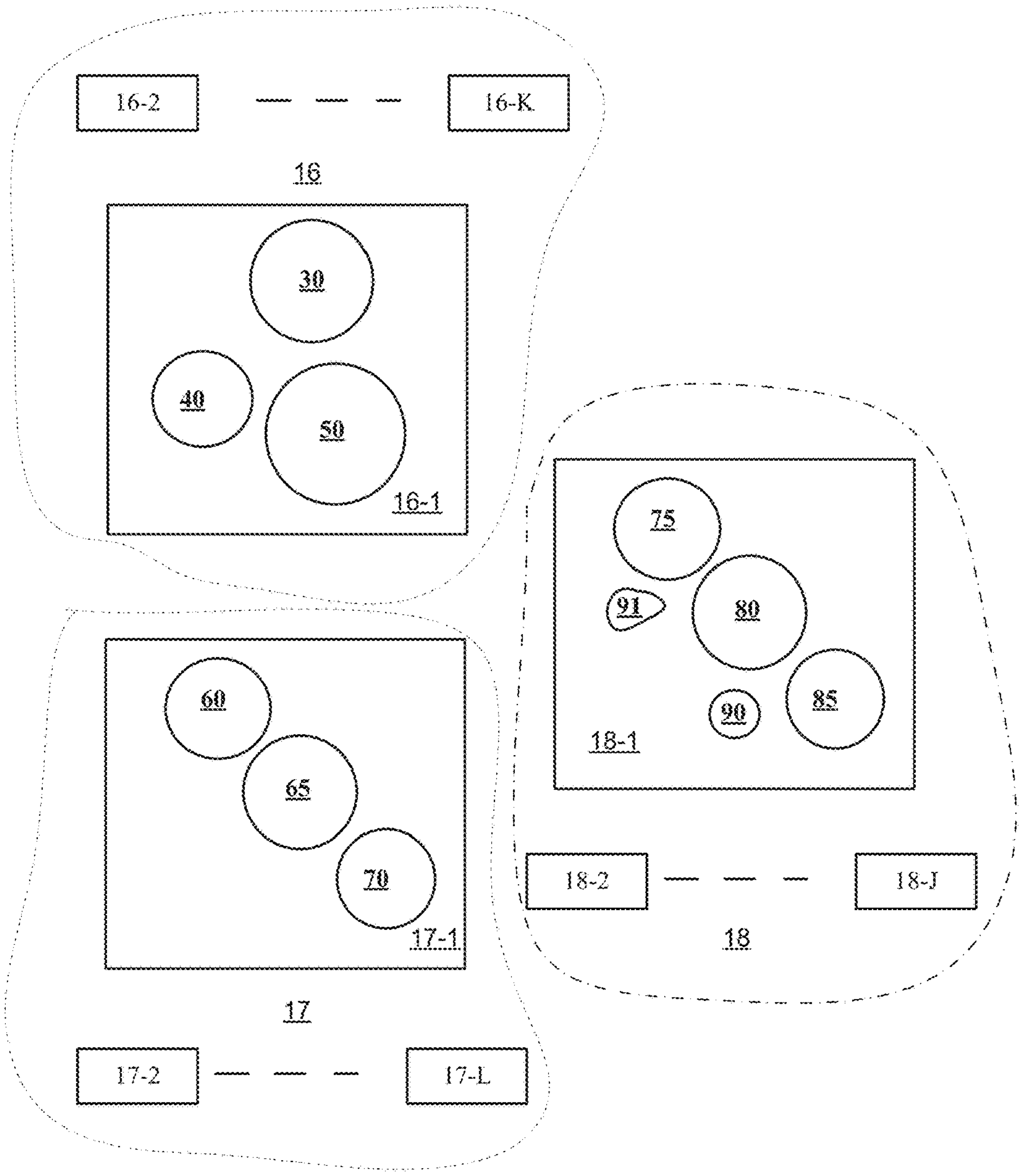
FIG. 5 illustrates an example of groups of images.

While FIGS. 2 and 4 illustrates three circular targets of the same GOI, there may be two or more GOIs. FIG. 5 illustrates an example of three different GOIs that are associated with different circular targets. It should be noted that a GOI may capture any number of circular targets-one, two, three or more than three. The number of images of one GOI may differ from the number of images or another GOI—or may include the same number of images.

FIG. 5 illustrates (i) a first GOI 16 that includes K images 16-1-16-K of the first circular target 20, the second circular target 30 and the third circular target 50, (ii) a second GOI 17 that includes L images 17-1-17-L of fourth circular target 60, fifth circular target 65 and sixth circular target 70, and (iii) a third GOI 18 that includes J images 17-1-17-J of seventh circular target 75, eighth circular target 80, ninth circular target 85 and circular targets candidates 90 and 91 to be ignored of. L, K and J are positive integers. There may be any relationship between L, K and J—for example all three (L, J, K) may be the same, only two out of the three may equal each other, or all three may differ from each other.

Figure 6:
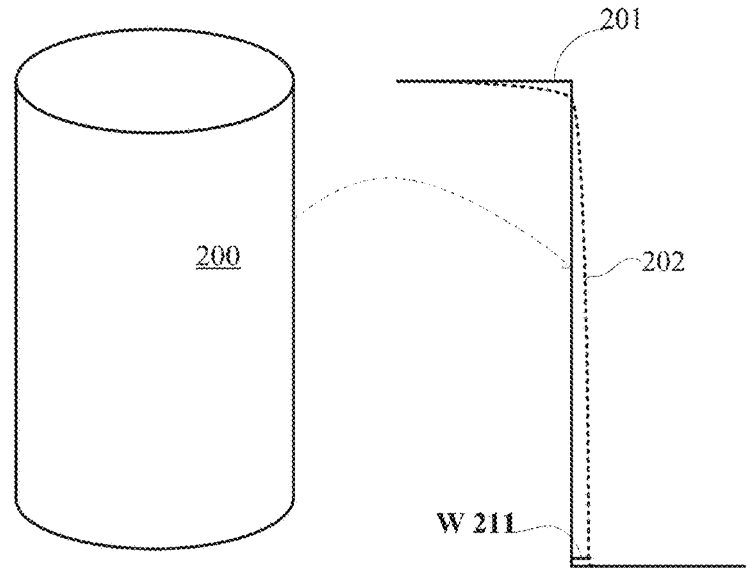
FIG. 6 illustrates an example of a circular target and of an edge.

FIG. 6 illustrates an ideal circular target 200 that has an edge 201 of zero width (note the cross section at the right part of FIG. 6), and of an edge 202 of an actual circular target that has a non-ideal width W 211 (note the cross section at the right part of FIG. 6). Non-ideal width W 211 is an example of a single measurement of the width of the actual circular target. Multiple widths of edges are found in each first-axis region of interest and in each second-axis region of interest. Step 125 of method 100 of FIG. 1 finds first-axis edge width information based on widths of edges of the circular targets that are within the first-axis regions of interest. Step 126 of method 100 of FIG. 1 finds second-axis edge width information based on widths of edges of the circular targets that are within the second-axis regions of interest.

Figure 7:
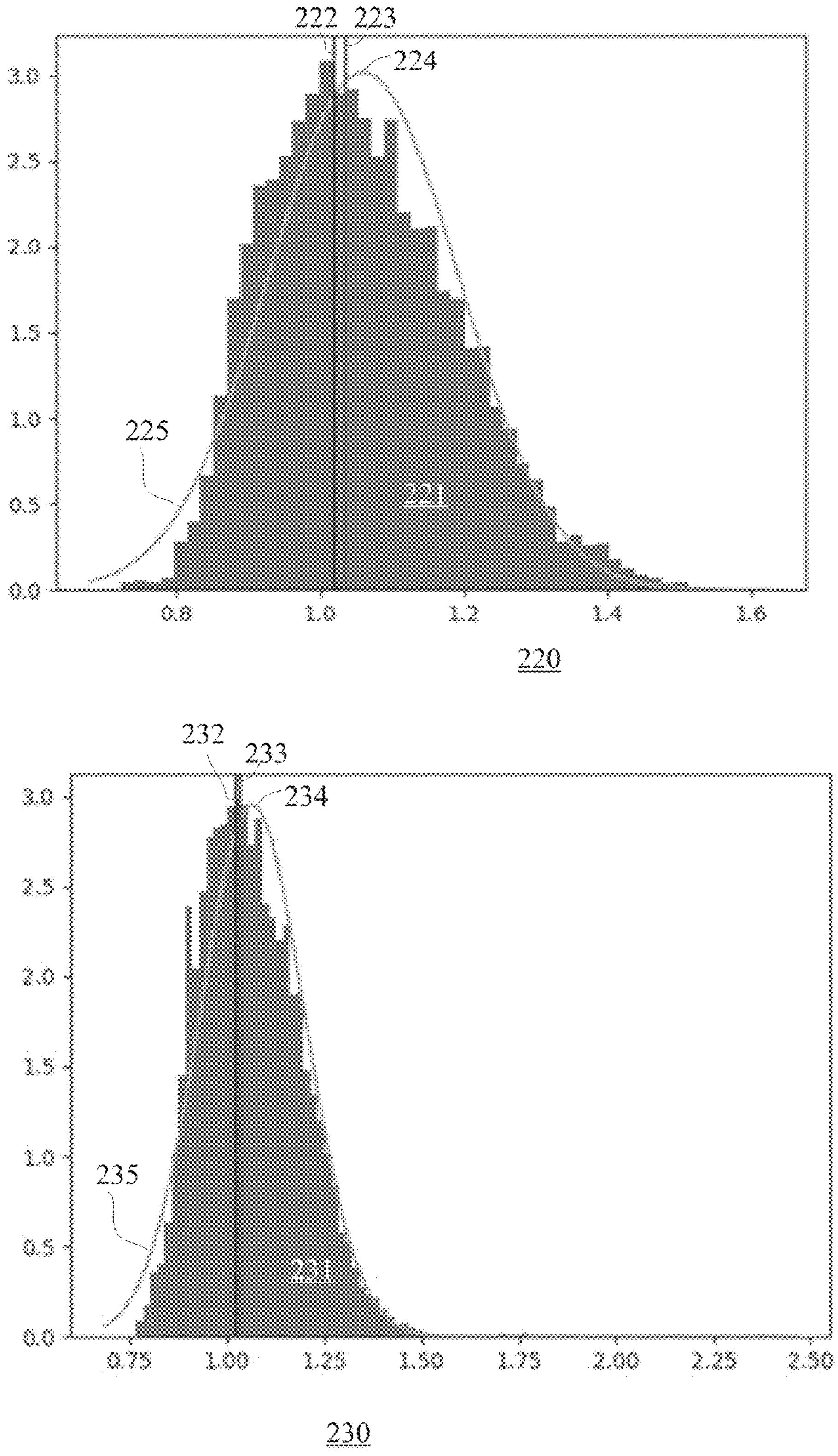
FIG. 7 illustrates an example of histograms.

FIG. 7 illustrates an example of an first-axis histogram 220 that includes bins 221, a parabolic approximation 225 of the first-axis histogram, a first peak 222 of the first-axis histogram that is calculated by applying a fit to norm algorithm, a second peak 223 of the first-axis histogram 220 that is calculated by applying a mean shift algorithm, and a third peak 224 of the first-axis histogram that calculated by finding a peak of parabolic approximation 224. The first-axis peak may be calculated by using a single algorithm. FIG. 7 illustrates three peaks that are calculated by three different algorithms to provide a comparison between the different algorithms.

Differences between values of peaks of histograms that are associated to different polar angles are attributed to radial asymmetry in the electron beam shape.

FIG. 7 also illustrates an example of an second-axis histogram 230 that includes bins 231, a parabolic approximation 235 of the second-axis histogram, a first peak 232 of the second-axis histogram that is calculated by applying a fit to norm algorithm, a second peak 233 of the second-axis histogram that is calculated by applying a mean shift algorithm, and a third peak 234 of the second-axis histogram that calculated by finding a peak of parabolic approximation 235.

Figure 8:
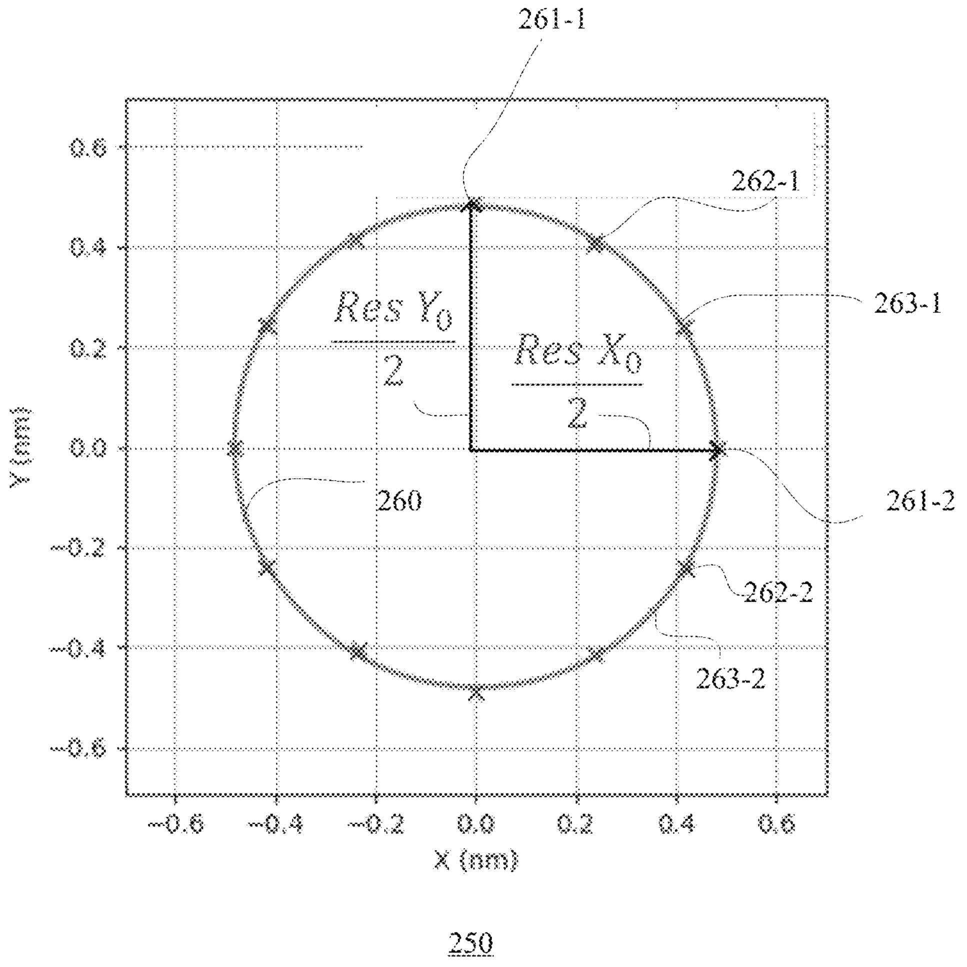
FIG. 8 illustrates an example of a reconstruction of an electron beam spot.

FIG. 8 illustrates an example of a reconstructing of an electron beam spot shape 260 based on the first-axis edge width information and second-axis edge width information. The electron beam spot shape 260 is reconstructed based on pairs of points—each pair includes a first-axis value and a second-axis value. FIG. 8 illustrates a grid 250 and six pairs of points denoted 261-1, 262-1, 263-3, 261-2, 262-2 and 263-2 that the associated with six different polar angles. The six pairs of points provide virtual sampling points of the electron beam shape. The electron beam shape is reconstructed based on the virtual sampling points. Any reconstruction process that is based on multiple sampling points can be used to reconstruct the electron beam shape—for example extrapolation, interpolation, and the like.

The reconstruction of the electron beam spot shape that uses images of circular targets allows to obtain sampling points from virtually any angle of the spot thereby increasing the accuracy of the reconstruction.

Figure 9:
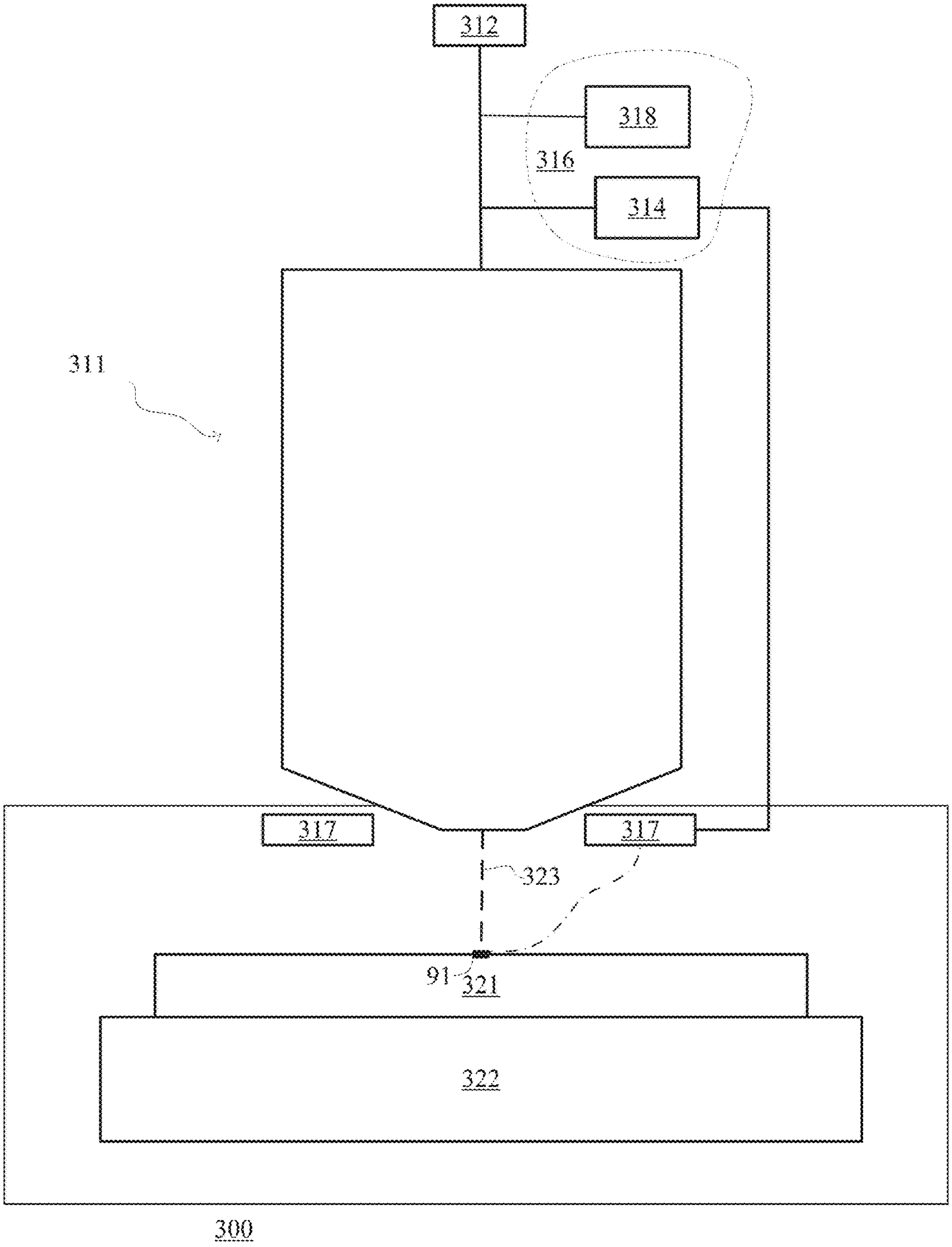
FIG. 9 illustrates an example of a system.

FIG. 9 illustrates an example of an electron beam system 300 and sample 321. The electron beam system 300 includes controller 312 for controlling the electron beam system 300, an electron beam spot shape reconstruction unit 316 that includes memory unit 318 and a processing circuit 314, a column 311 for generating and manipulating an electron beam 323 to scan an area 91 of the sample 321 to provide frames that may be processed to provide one or more captured images. The electron beam system 300 also includes a sensor 317 for sensing electrons emitted from the sample due to the illumination of the sample with the electron beam 323. The sample is supported by a mechanical unit 322.

It should be noted that the electron beam spot shape reconstruction unit 316 may not belong to the electron beam system 300. According to an embodiment the electron beam system 300 is configured to execute method 100. According to an embodiment, at least the electron beam spot shape reconstruction unit 316 is configured to execute method 100.

In the foregoing specification, the embodiments of the disclosure have been described with reference to specific examples of embodiments. It will, however, be evident that various modifications and changes may be made therein without departing from the broader spirit and scope of the appended claims.

Moreover, the terms “front,” “back,” “top,” “bottom,” “over,” “under” and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms “assert” or “set” and “negate” (or “deassert” or “clear”) are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any reference to the term “comprising” or “having” or “including” should be applied mutatis mutandis to “consisting” and/or should be applied mutatis mutandis to “consisting essentially of”.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for reconstructing an electron beam spot shape, the system comprising:

a processing circuit; and a memory unit storing computer-readable instructions that, when executed by the processing circuit, cause the system to:

obtain multiple groups of images of a sample, each group comprising images of a plurality of reference structures formed on the sample, each reference structure comprising a cylindrical body extending perpendicularly from a top surface of the sample, the cylindrical body having a circular top surface, wherein for each group of the multiple groups of images, the images within the group are associated with different polar angles relative to the electron beam spot;

process at least two of the multiple groups of images to: (i) identify edge regions corresponding to the circular top surfaces of the reference structures, and (ii) determine, for each group, edge width information along a first axis and along a second axis, the first and second axes being non-parallel directions within a plane of the top surface of the sample; and reconstruct a two-dimensional shape of the electron beam spot by: (i) mapping the first-axis and second-axis edge width information as virtual sampling points onto a coordinate grid; and (ii) interpolating between the virtual sampling points to generate a continuous spot shape profile.

2. The system according to claim 1 wherein the multiple group of images comprises at least one virtually rotated group of images that is generated by virtually polar angle rotating images of a captured group of images of the multiple images.

3. The system according to claim 2 wherein the captured group of images is obtained by illuminating a sample with an electron beam that forms the electron beam spot on the sample.

4. The system-according to claim 3 wherein the processing circuit is configured to generate the multiple groups of images by: (i) receiving the captured group of images, and (ii) virtually polar angle rotating the captured group of images to provide a plurality of virtually rotated groups of images.

5. The system according to claim 1 wherein at least two groups of the multiple groups of images are obtained by performing multiple illumination iterations that differ from each by a polar angle of illumination of the electron beam that forms the electron beam spot on the sample.

6. The system according to claim 1 wherein the processing circuit is configured to generate, for each axis and each group of images, a histogram of measured edge widths and to determine a representative edge width value for the group and axis by identifying a peak in the histogram.

7. The system according to claim 1 wherein the processing circuit is configured to identify edge regions corresponding to the circular top surfaces by generating derivative images and performing segmentation or blob analysis to detect edges.

8. The system according to claim 1 wherein the processing circuit is configured to extract intensity profiles along the first axis and the second axis through the center of each circular top surface in the images, and to determine the width of a transition region in each profile as the edge width.

9. The system according to claim 1 wherein at least one of the multiple groups of images is obtained by digitally a captured group of images to simulate a virtual polar angle of illumination with respect to the reference structures, and wherein the processing circuit identifies edges of the circular top surfaces, extracts intensity profiles along mutually perpendicular axes, determines edge widths for each axis, generates histograms of the edge widths, determines representative edge width values by finding histogram peaks, and reconstructs the two-dimensional shape of the electron beam spot by combining the representative values from multiple polar angles.

10. A computer-implemented method for reconstructing an electron beam spot shape, the method comprises:

obtaining, by a processor, multiple groups of images of a sample, each group comprising images of a plurality of reference structures formed on the sample, each reference structure comprising a cylindrical body extending perpendicularly from a top surface of the sample, the cylindrical body having a circular top surface, wherein for each group of the multiple groups of images, the images within the group are associated with different polar angles relative to the electron beam spot;

processing, by the processor, at least two of the multiple groups of images to: (i) identify edge regions corresponding to the circular top surfaces of the reference structures, and (ii) determine, for each group, edge width information along a first axis and along a second axis, the first and second axes being non-parallel directions within a plane of the top surface of the sample; and reconstructing, by the processor, a two-dimensional shape of the electron beam spot shape by: (i) mapping the first-axis and second-axis edge width information as virtual sampling points onto a coordinate grid; and (ii) interpolating between the virtual sampling points to generate a continuous spot shape profile.

11. The computer-implemented method of claim 10, wherein at least one of the multiple groups of images associated with a different polar angle is generated by digitally rotating a captured group of images to simulate a virtual polar angle of illumination with respect to the reference structures.

12. The method of claim 10, wherein at least two of the multiple groups of images are obtained by illuminating the sample with the electron beam at different physical polar angles of incidence.

13. The method of claim 10, wherein identifying edge regions corresponding to the circular top surfaces of the reference structures comprises generating derivative images of the groups of images and performing segmentation or blob analysis to detect edges.

14. The method of claim 10, wherein determining edge width information along the first axis and the second axis comprises, for each reference structure, extracting intensity profiles along the first axis and the second axis through the center of the circular top surface, and measuring the width of a transition region in each profile corresponding to the edge region.

15. The method of claim 10, wherein for each axis and each group of images, a histogram of measured edge widths is generated, and a representative edge width value for the group and axis is determined by identifying a peak in the histogram.

16. A non-transitory computer readable medium for reconstructing an electron beam spot shape, the non-transitory computer readable medium storing instructions that once executed by a processor in a system for reconstructing an electron beam spot shape, cause the system to:

obtain multiple groups of images of a sample, each group comprising images of a plurality of reference structures formed on the sample, each reference structure comprising a cylindrical body extending perpendicularly from a top surface of the sample, the cylindrical body having a circular top surface, wherein for each group of the multiple groups of images, the images within the group are associated with different polar angles relative to the electron beam spot;

process at least two of the multiple groups of images to: (i) identify edge regions corresponding to the circular top surfaces of the reference structures, and (ii) determine, for each group, edge width information along a first axis and along a second axis, the first and second axes being non-parallel directions within a plane of the top surface of the sample; and reconstruct a two-dimensional shape of the electron beam spot shape by: (i) mapping the first-axis and second-axis edge width information as virtual sampling points onto a coordinate grid; and (ii) interpolating between the virtual sampling points to generate a continuous spot shape profile.

17. The non-transitory computer readable medium according to claim 13 wherein the multiple group of images comprises at least one group of virtually rotated images that is generated by virtually polar angle rotating images of a captured group of images of the multiple images, wherein the captured group of images is obtained by illuminating a sample with an electron beam that forms the electron beam spot on the sample.

18. The non-transitory computer readable medium according to claim 17 that stores instructions for generating the multiple groups of images by: (i) receiving the captured group of images, and (ii) digitally polar angle rotating the captured group of images to provide a plurality of virtually rotated groups of images.

19. The non-transitory computer readable medium according to claim 16 that stores instructions for obtaining the multiple groups of images by performing multiple illumination iterations that differ from each other by a polar angle of illumination of the electron beam that forms the electron beam spot on the sample.

20. The non-transitory computer readable medium according to claim 16 that stores instructions for generating, for each axis and each group of images, a histogram of measured edge widths and to determine a representative edge width value for the group and axis by identifying a peak in the histogram.

21. An electron beam spot shape reconstruction system comprising a processor and a memory unit, the memory unit storing instructions that, when executed by the processor, cause the system to:

obtain a plurality of groups of images of circular targets of a sample, wherein each group is associated with a different polar angle;

calculate edge width information for each group of images by: (i) generating derivative images from the groups of images; (ii) defining regions of interest related to edges of the circular targets within the derivative images; (iii) generating histograms of edge widths within the regions of interest; and (iv) identifying a peak of each histogram using a parabolic approximation algorithm to define a discrete edge width value;

map the discrete edge width values to a coordinate grid as virtual sampling points, where each virtual sampling point is positioned on the grid based on its corresponding discrete edge width value and polar angle; and reconstruct a continuous two-dimensional electron beam spot shape profile by interpolating between the virtual sampling points on the coordinate grid.

* * * * *